(12) United States Patent
Lan

(10) Patent No.: US 11,178,773 B2
(45) Date of Patent: Nov. 16, 2021

(54) CONDUCTOR TRACE STRUCTURE REDUCING INSERTION LOSS OF CIRCUIT BOARD

(71) Applicant: Sheng-Kun Lan, Taipei (TW)

(72) Inventor: Sheng-Kun Lan, Taipei (TW)

( * ) Notice: Subject to any disclaimer, the term of this patent is extended or adjusted under 35 U.S.C. 154(b) by 0 days.

(21) Appl. No.: 16/949,509

(22) Filed: Oct. 30, 2020

(65) Prior Publication Data

US 2021/0136919 A1 May 6, 2021

(30) Foreign Application Priority Data

Nov. 1, 2019 (TW) .................. 108139814

(51) Int. Cl.

| H05K 1/02 | (2006.01) |
| H05K 1/03 | (2006.01) |
| H05K 1/09 | (2006.01) |
| H05K 1/11 | (2006.01) |
| H05K 1/18 | (2006.01) |
| H05K 3/00 | (2006.01) |
| H05K 3/10 | (2006.01) |

(Continued)

(52) U.S. Cl.
CPC ......... *H05K 3/0023* (2013.01); *H05K 1/0366* (2013.01)

(58) Field of Classification Search
CPC .. H05K 1/02; H05K 1/03; H05K 1/09; H05K 1/11; H05K 1/18; H05K 1/113; H05K 1/0206; H05K 1/0366; H05K 3/00; H05K 3/03; H05K 3/10; H05K 3/18; H05K 3/24; H05K 3/28; H05K 3/42; H05K 3/46; H05K 3/103; H05K 3/205; H05K 3/282; H05K 3/381; H05K 3/384; H05K 3/0023; H05K 3/4658
USPC ......... 174/251, 255, 268; 428/612; 257/691, 257/738, 778; 156/60, 150, 247; 205/78, 205/125

See application file for complete search history.

(56) References Cited

U.S. PATENT DOCUMENTS

| 2008/0128288 A1* | 6/2008 | Hashimoto ............ H05K 3/205 205/125 |
| 2008/0303150 A1* | 12/2008 | Chang ................. H01L 21/6835 257/738 |

(Continued)

*Primary Examiner* — Xiaoliang Chen
(74) *Attorney, Agent, or Firm* — Rosenberg, Klein & Lee

(57) ABSTRACT

A conductor trace structure reducing insertion loss of circuit board, the circuit board laminates an outer layer circuit board, an inner layer circuit board and a glass fiber resin films which arranged between each board; before laminated process, the conductor traces of the inner layers had formed by etching of imaging transfer process and conductor traces had been roughed process for making the glass fiber resin films having good adhesive performance during laminating; before etching of imaging transfer process that forms the conductor traces of the outer layers or solder resist coat process or coating polymer materials, the conductor traces have been roughed process to make insulating resin layer of the solder resist coat or polymer materials to has better associativity; wherein a smooth trench is formed by physical or chemical process constructed on the roughed conductor traces surface to guide electric ions transmitted on these smooth trench surface to enhance electric ions transmission rate, resulting in reducing the impedance so as to achieve reducing insertion loss.

6 Claims, 7 Drawing Sheets

(51) Int. Cl.
    *H05K 3/18*     (2006.01)
    *H05K 3/24*     (2006.01)
    *H05K 3/28*     (2006.01)
    *H05K 3/42*     (2006.01)
    *H05K 3/46*     (2006.01)
    *H01L 21/00*     (2006.01)
    *H01L 21/58*     (2006.01)
    *H01L 21/60*     (2006.01)
    *H01L 23/48*     (2006.01)
    *H01L 23/52*     (2006.01)
    *H01L 23/66*     (2006.01)
    *H01L 23/488*     (2006.01)
    *H01L 23/528*     (2006.01)

(56) References Cited

U.S. PATENT DOCUMENTS

| | | | |
|---|---|---|---|
| 2009/0001547 A1* | 1/2009 | Chang | H01L 21/4846 |
| | | | 257/691 |
| 2009/0001603 A1* | 1/2009 | Chang | H01L 25/50 |
| | | | 257/778 |
| 2009/0008766 A1* | 1/2009 | Chang | H01L 25/0652 |
| | | | 257/691 |
| 2012/0080137 A1* | 4/2012 | Lin | C25D 5/02 |
| | | | 156/150 |
| 2013/0224513 A1* | 8/2013 | Hsu | H05K 3/28 |
| | | | 428/612 |
| 2013/0255858 A1* | 10/2013 | Hsu | H05K 3/282 |
| | | | 156/150 |
| 2013/0284500 A1* | 10/2013 | Hsu | H05K 3/388 |
| | | | 174/255 |
| 2019/0378817 A1* | 12/2019 | Lin | H01L 23/3121 |
| 2020/0365533 A1* | 11/2020 | Manepalli | H01L 23/66 |

* cited by examiner

CONDUCTOR TRACE STRUCTURE REDUCING INSERTION LOSS OF CIRCUIT BOARD

BACKGROUND OF THE INVENTION

1. Field of the Invention

A circuit board, especially one that has a smooth trench formed by physical or chemical process which are constructed on the surface of these roughed conductor traces surface to guide electric ions transmit on these smooth trench surface to enhance electric ions transmission rate. The insertion loss is reduced by these smooth trenches on roughed conductor traces.

2. Description of the Related Art

Electronic products, whether they are televisions, mobile phones, computers, etc., they have circuit boards inside them. The main function of the circuit board is to connect the electronic parts together, and the PCB (Printed Circuit Board) is a substrate made of non-conductive materials (di-electrical layer). The conductive copper foil attached to the surface is used to form a copper foil laminated (CCL).

The circuit board, its conductor traces are formed by imaging transfer process.

Before imaging transfer process, Copper foil surface roughed by physical methods, such as buffing and pumice. Chemical methods have such as micro etching, to have adhesion between copper foil and dry-film. The dry-film laminated on copper foil surface, and then the dry film is exposed by UV exposure at the process recipes of temperature and pressure. The photoresist will be polymerized after being irradiated by ultraviolet rays in the light-transmitting area of the negative (the dry film in this area will be remained for etching process to protect coppers), and these traces imaging on the negative film is transferred to the dry film photoresist of the board surface, and without UV exposure area of the dry film photoresist are removed with an alkaline aqueous solution such as sodium carbonate aqueous solution.

The dry film photoresist exposed areas are removed by chemical process. These chemical methods have such as hydrochloric acid aqueous solution, or sulfuric acid, hydrogen peroxide solution, or alkaline aqueous solution.

The reaction is corroding coppers to remove coppers to form these conductor traces.

As electronic products are mostly developing in the direction of rapidity and functionality, Single-side circuit boards have evolved into multi-layers circuit boards.

The structure of a general multi-layers circuit board is shown in FIG. 3

At least an inner layer circuit board 920 is formed, each layers of circuit board has conductor traces 930, and with via 940 connecting each layer of conductor traces 930.

The process flow is shown in FIG. 1. It is a circuit board that has completed imaging transfer process the inner layer conductor traces 901 (including dry-film photoresist laminated, photoresist exposure, photoresist development and etching process), a glass fiber resin film is laminated between inner layers or outer layers for pressing 903.

Before laminated process, the conductor traces need to do coarse treatment 902, to have good adhesion with the glass fiber resin film during the laminated process. The inner layers of boards laminated together can perform drilling process 904, including via holes (including through via and blind via).

And go to next process copper plating 905 to connect conductor traces on each layers.

Then proceed the outer conductor circuit board process 906 (including dry-film photoresist laminated, photoresist exposure, photoresist development and etching process), and proceed solder resist coated process 908, which is to coat an insulating photo resist on the conductor traces to avoid its conductor traces oxidation (copper traces), and before the solder resist coated process 908, the conductor traces also needs to do coarse treatment 907, so that the conductor traces have insulated by solder resist coated 908 with good adhesion performance.

SUMMARY OF THE INVENTION

A primary objective of the present invention is to build one or more smooth trenches on roughed conductor traces surface for these inner layers and outer layers are constructed by physical process or chemical process to guide electric ions transmit on these smooth trench surface to enhance electric ions transmission rate. The insertion loss is reduced by these smooth trenches on roughed conductor traces surface.

The present invention applies the principle of Skin Effect and Hammerstad-Jensen Model due to these electron ions concentrate on skin of conductor traces around in high frequency transmission, also because these roughed conductor traces surface cause to extend surface route length is reduced electron ions transmission rate.

since the electric field drives the movement of electrons, that is, the current, and when the current moving will form a magnetic field around it, According to Ampere's right-hand rule, if the thumb points to the direction of the current, the direction of the magnetic field is the direction in which the other four fingers bend. The intensity is strongest at the center and weaker as it is farther from the center (inversely proportional to the square of the distance).

When the magnitude of the current changes, the intensity of the magnetic field also changes, and this changing magnetic field will form a reverse electric field (Law of Frozen Time). Similarly, the central magnetic field of the conductor changes the most, and the reverse electric field is also the largest.

In this way, the electric field density in the center of the conductor is much smaller than the outside, that is, the current density in the center of the conductor is much smaller than the outside, thus forming the Skin Effect.

In order to achieve the above objective, the technical means adopted by the present invention included as follow, the circuit board is constructed of at least one outer layer circuit board, at least one inner layer circuit board and at least one glass fiber resin film are laminated together.

And before laminated process, the inner layer circuit board has been etched to form a conductor traces with roughed conductor traces surface, so that it has adhesion performance with the glass fiber resin film during the laminated process.

The outer layer circuit board is formed by etching of imaging transfer process to form conductor traces. Before the solder resist or polymer materials coated, the conductor traces need to be roughed to get adhesive performance between solder resist or polymer materials and conductor traces.

It is characterized in that at least one of the inner and outer layers circuit board is constructed smooth trench on the roughed conductor traces surface to guide electric ions transmit on these smooth trench surface to enhance electric ions transmission rate. The insertion loss is reduced by these smooth trenches on roughed conductor traces surface.

According to the aforementioned features, the smooth trench in the present invention further includes rectangular grooves or grooves with other geometric shapes.

According to the aforementioned features, in the present invention, the smooth trench includes a single groove.

According to the features disclosed above, in the present invention, the smooth trenches included plurality of grooves.

According to the aforementioned features, the smooth trenches in the present invention included physical methods, chemical method, or a combination of the two. It includes any one or a combination of laser treatment, mechanical cutting treatment, imaging transfer process, plasma etching process.

With the help of the aforementioned features, the "A conductor trace structure to reducing insertion loss of circuit board" of the present invention has the following benefits: the present invention is to construct one or more smooth trenches conductor traces on the roughed conductor traces surface of the inner and outer layers circuit boards. The smooth trenches formed by physical or chemical methods are based on the principle of skin effect and Hammerstad-Jensen Model.

The characteristic that the electron ions will be concentrated in the "skin" part of the smooth trenches conductor traces, the multiple geometric grooves will increase the smooth trench area of the "skin" of the conductor traces, and can also to enhance electric ions transmission rate, thereby reducing the insertion loss of the roughed conductor trace.

DETAILED DESCRIPTION OF THE PREFERRED EMBODIMENT

For better understanding of present invention, I provide the embodiment and drawing enclosed for detailed description. Those who skilled in the art can understand purpose, the feature and benefit of the present invention from the contents disclosed in this specification. Kindly noted that the present invention can be implemented or applied through other different specific embodiments and based on different viewpoints various details in this specification can be various changed without departing from the spirit of the present invention. In addition, the drawings attached to the present invention are merely a schematic illustration and they are not depicted in actual dimensions. The following embodiments will further describe the related technical content of the present invention in detail, but the disclosed content is not intended to limit the technical scope of the present invention.

Figure 1:
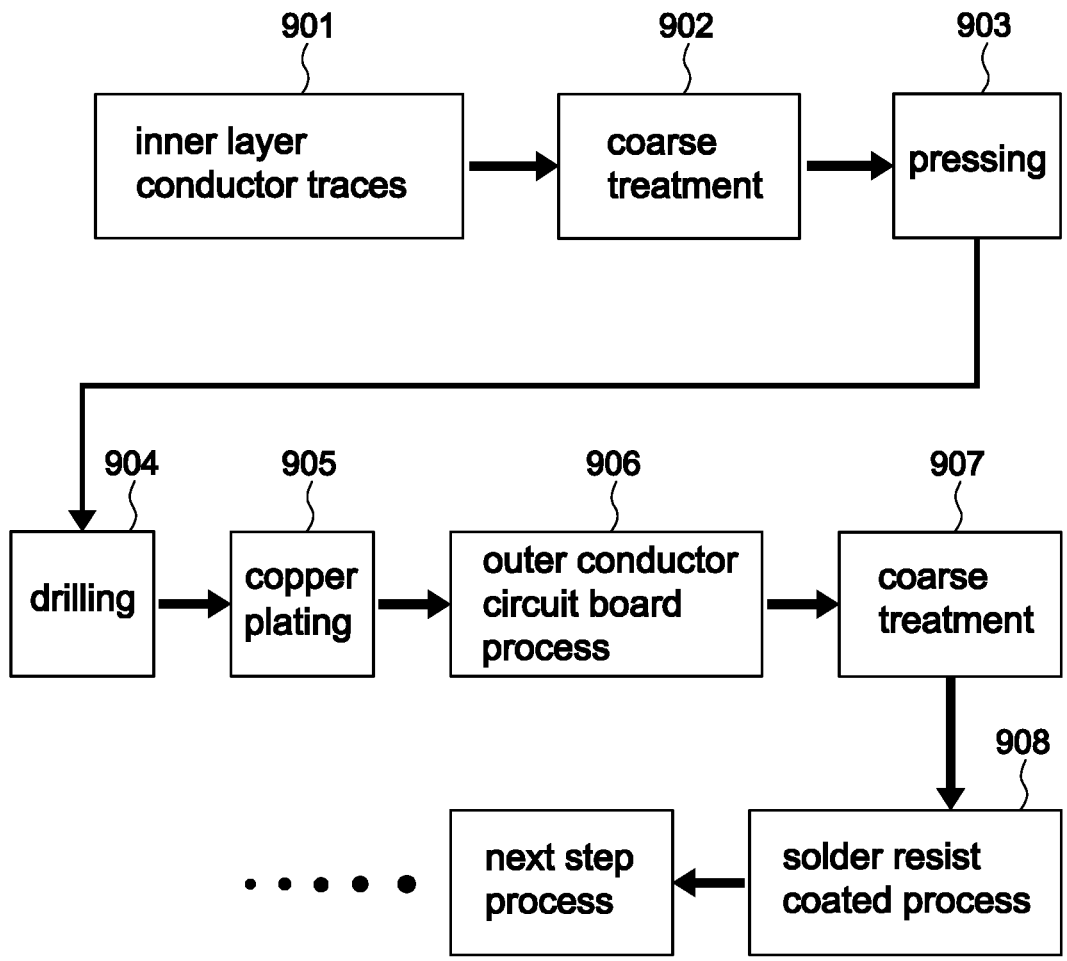
FIG. 1 is a block diagram illustrating the manufacturing process of the prior art.
Figure 2:
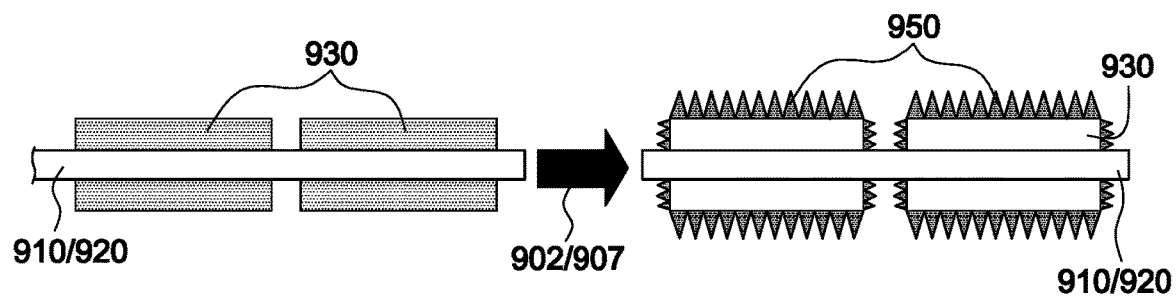
FIG. 2 is a schematic diagram of prior art doing coarse treatment.
Figure 3:
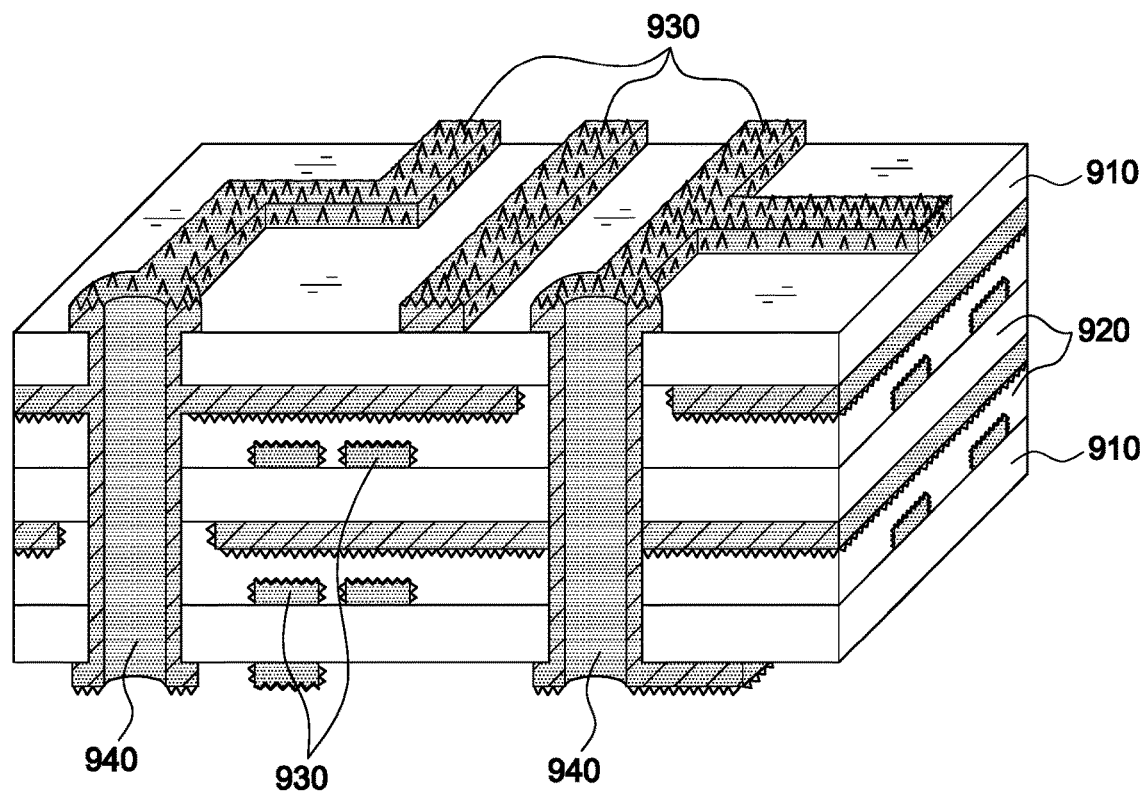
FIG. 3 is a schematic diagram illustrating the structure of the multilayers circuit board of the prior art.
Figure 4:
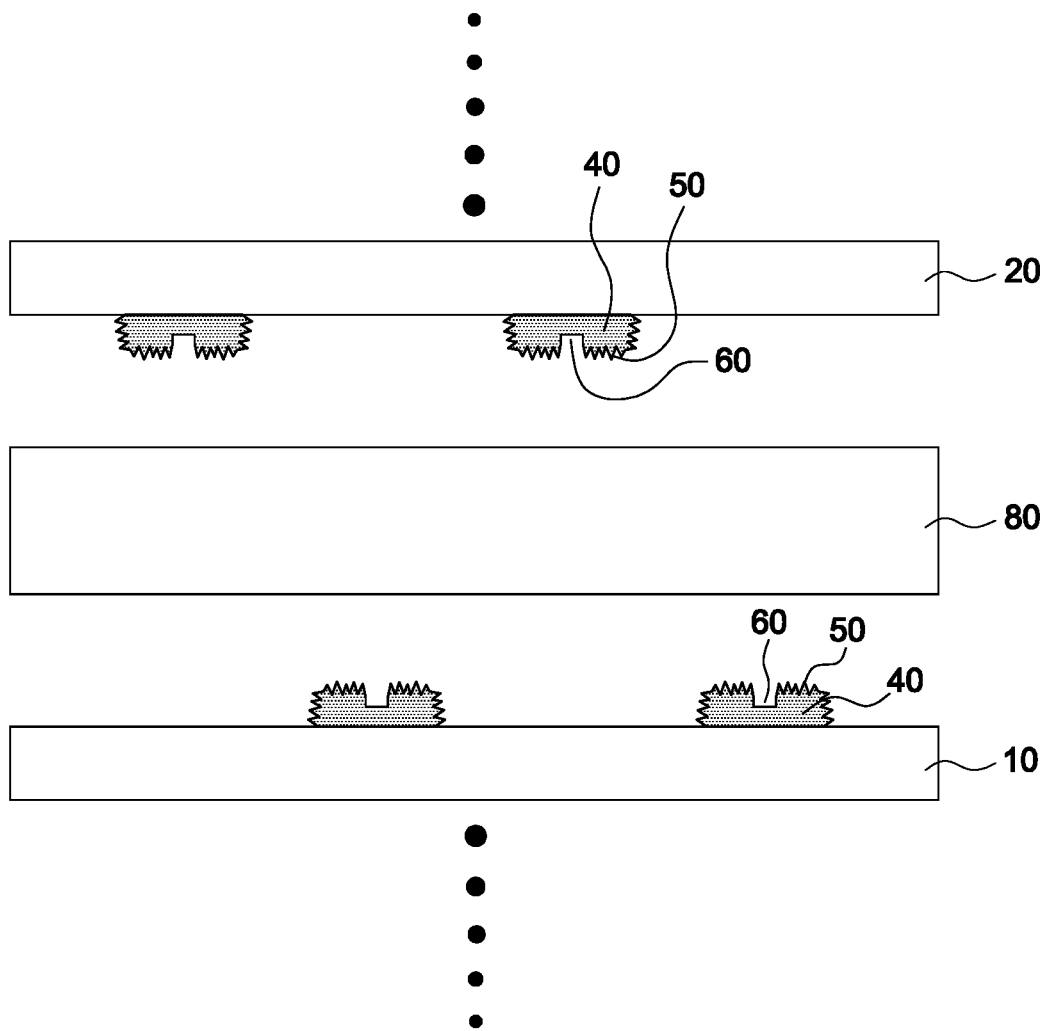
FIG. 4 is a schematic diagram illustrating the structure of the multilayers circuit board.
Figure 5:
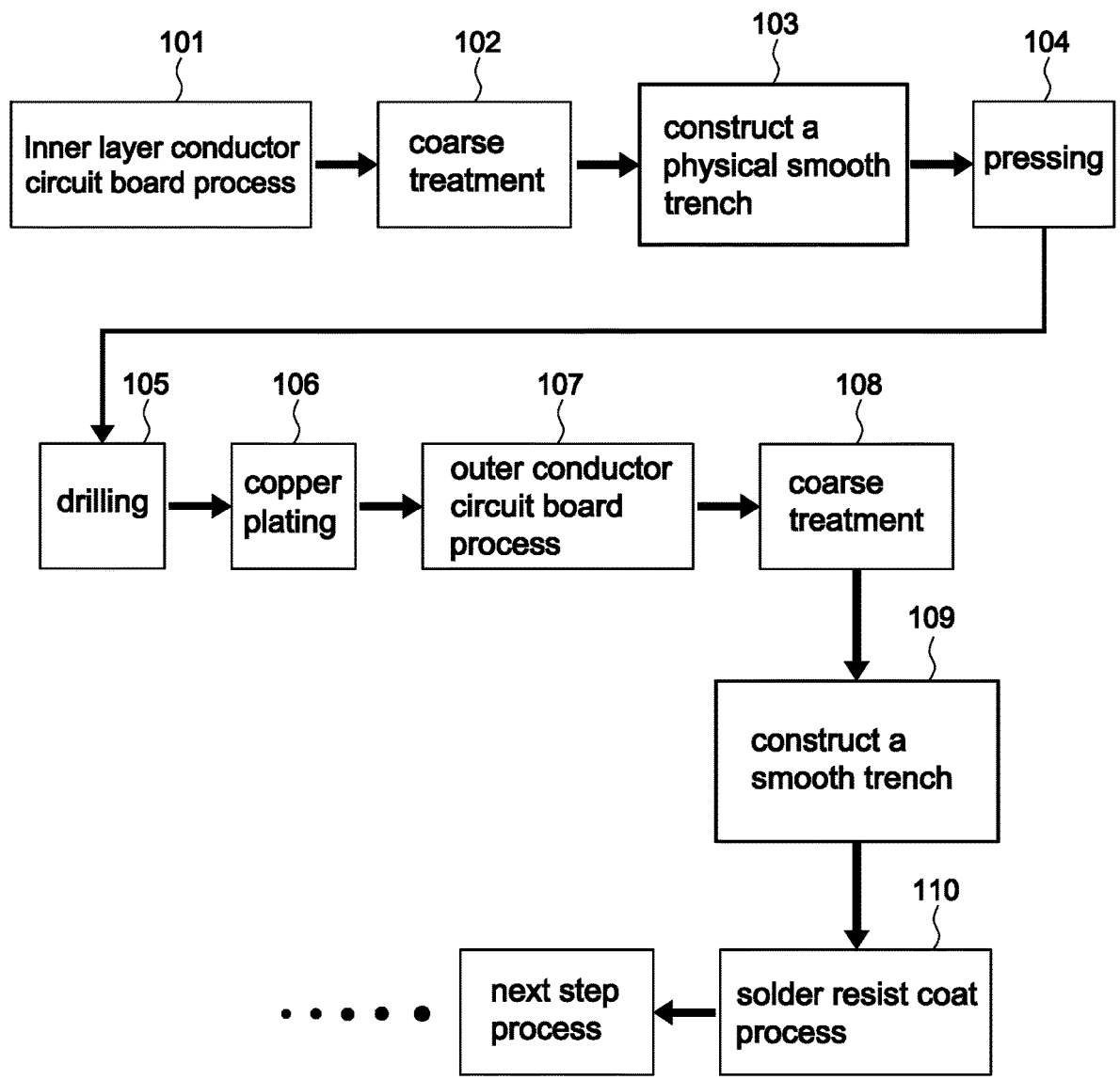
FIG. 5 is a block diagram illustrating the manufacturing process of the structure of the present invention.

First, please refer to FIG. 4, which is a multilayer circuit board structure, which includes at least one outer layer circuit board 20, at least one inner layer circuit board 10, and a circuit board 10/20 separately placed between each layer The glass fiber resin film 80 is formed by pressing with a laminating machine; and in the present invention, depending on the needs of electronic products, the structure can be expanded into a plurality of inner circuit boards 10, or use its outer layers buildup as the structure of the outer circuit board 20. The manufacturing process of the "structure for reducing the signal loss of circuit board conductors" of the present invention is shown in FIG. 5, which is processed a plurality of copper foil substrates including manufacturing processes of photoresist, exposure, development and etching to form the inner layer circuit board process 101, the copper foil substrate is formed into an inner layer circuit board 10 with a conductor circuit 40, and then the conductor circuit 40 do a coarse treatment 102 to form a roughened surface 50, and on the surface of the conductor circuit 40 construct a physical smooth trench 103/60, and then place a glass fiber resin film 80 between each circuit board, and apply a pressing machine to press 104; press a plurality of inner circuit boards 10 into one Then, the drilling 105 operation can be performed. The drilling 105 includes a through hole (including buried holes) and a part fixing hole. Then, the through hole is plated with copper 106 to complete the circuit connection of the conductor line 40 between each layer. The connection system includes photoresist compression molding, photoresist exposure, photoresist development and circuit etching on the outer conductor circuit process 107 of the outer layer board, so that the outer circuit board 20 has a conductor circuit 40, and then the conductor circuit 40 do a coarse treatment 108 to form a roughened surface 50, and construct physical smooth trenches 109/60 on the surface of the conductor circuit 40, and the subsequent solder resist coating 110 is to cover the conductor circuit 40 with an insulating resin layer to prevent oxidation.

Figure 6A:
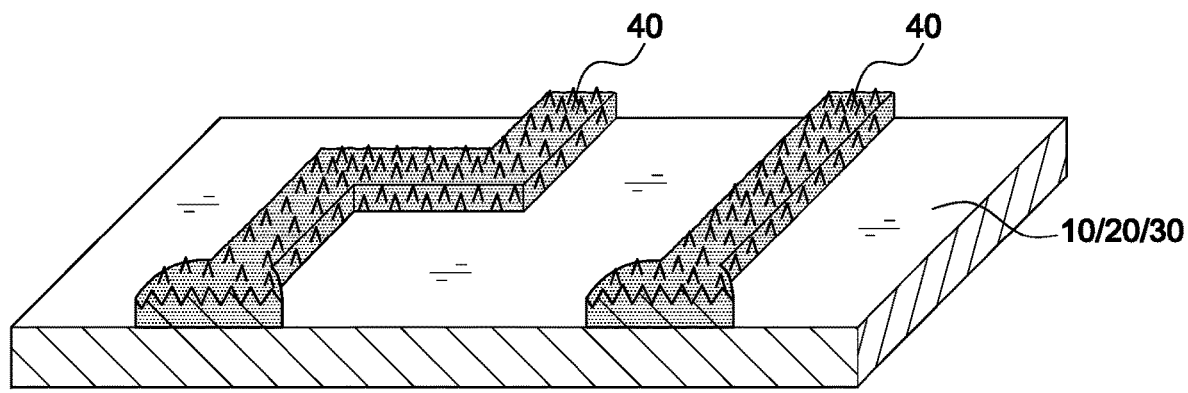
FIG. 6A is a schematic diagram illustrating the structure of the roughed conductive traces surface.

Due to the roughening of the surface of the conductive traces on the circuit board, the transmission rate will be reduced. As shown in FIG. 5A, the configuration of the inner and outer layers circuit boards 10/20 and the conductive traces 40 formed on the substrate 30 is shown in FIG. 6A shows the conductive traces 40 with a roughed surface 50. Its shape is like countless peaks 501 and valleys 502. Since electrons e-flowing on the conductor line 40 like climbing over a mountain, the resistance is increased, so its current goes through the conductive traces 40, the flow rate will be reduced due to impedance increased. The principle of the skin effect is to concentrate electron ions on the "skin" of the conductive traces to reduce the impedance of the current flow rate, therefore, the present invention applies the principle, as shown in FIG. 5B, a smooth trench 60 is constructed on the surface of the conductor line 40; in this embodiment, the smooth trench 60 includes a physical methods, chemical method, or a combination of the two. It includes any one or a combination of laser treatment, mechanical cutting treatment, imaging transfer process, plasma etching process.

Figure 6B:
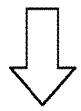
FIG. 6B is a schematic diagram illustrating the structure smooth trenches that constructed on the roughed conductive traces surface.
Figure 6B:
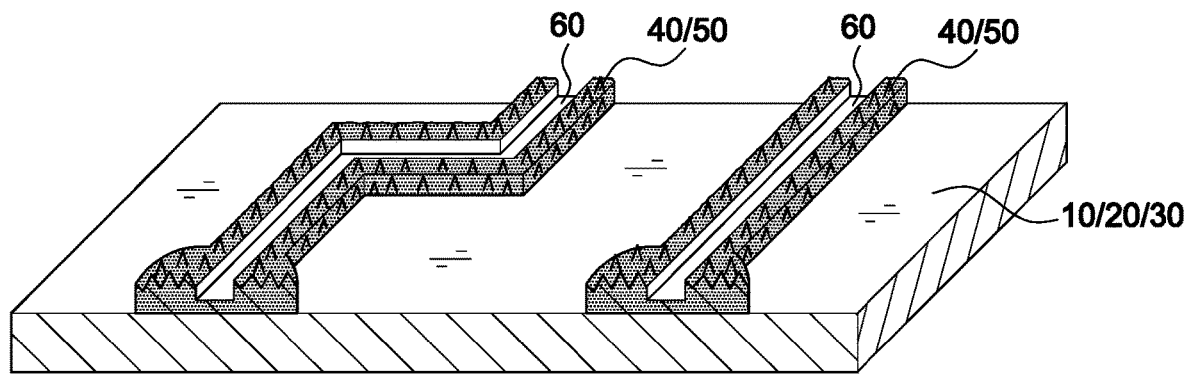
Figure 7A:
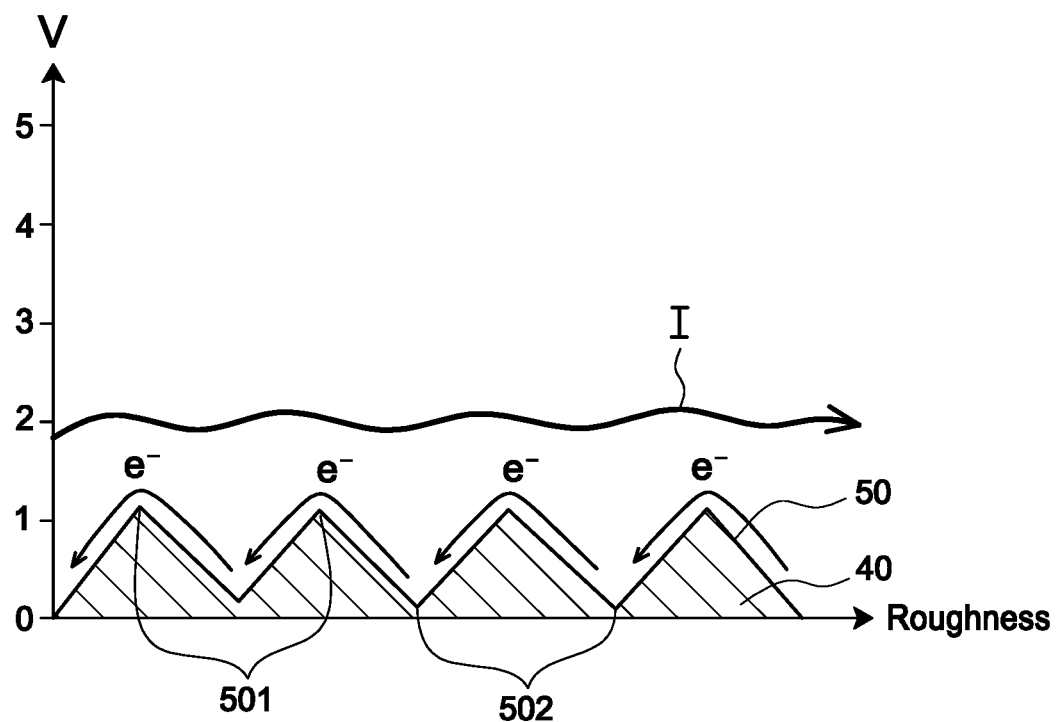
FIG. 7A is a schematic diagram illustrating the current flow rate and electric ions transmission rate reduction due to the influence of the roughed conductive traces surface.
Figure 7B:
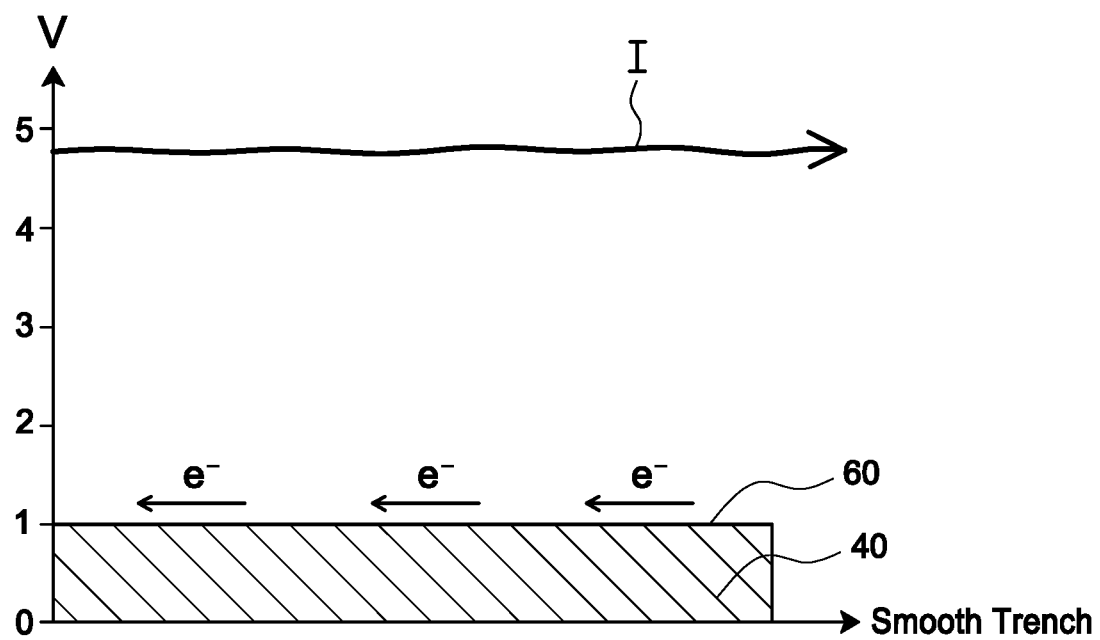
FIG. 7B is a schematic diagram illustrating the current flow rate and electric ions transmission rate enhancement due to the influence of the smooth conductive traces surface.
Figure 8:
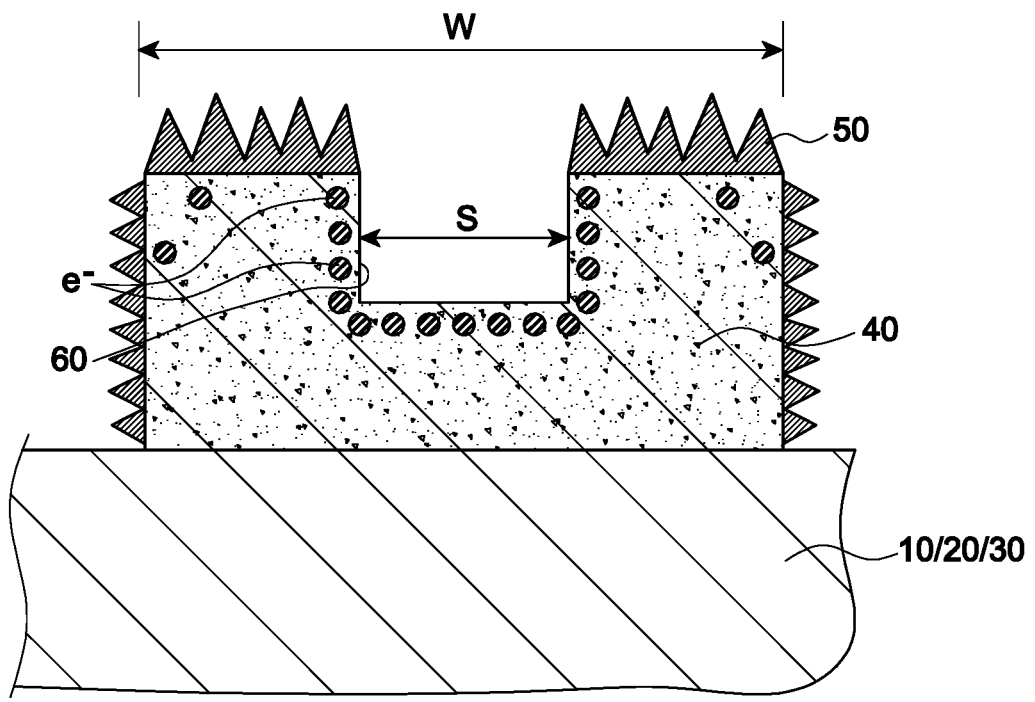
FIG. 8 is a schematic diagram illustrating one rectangular smooth trench on roughed conductive traces surface formed by the present invention.
Figure 9:
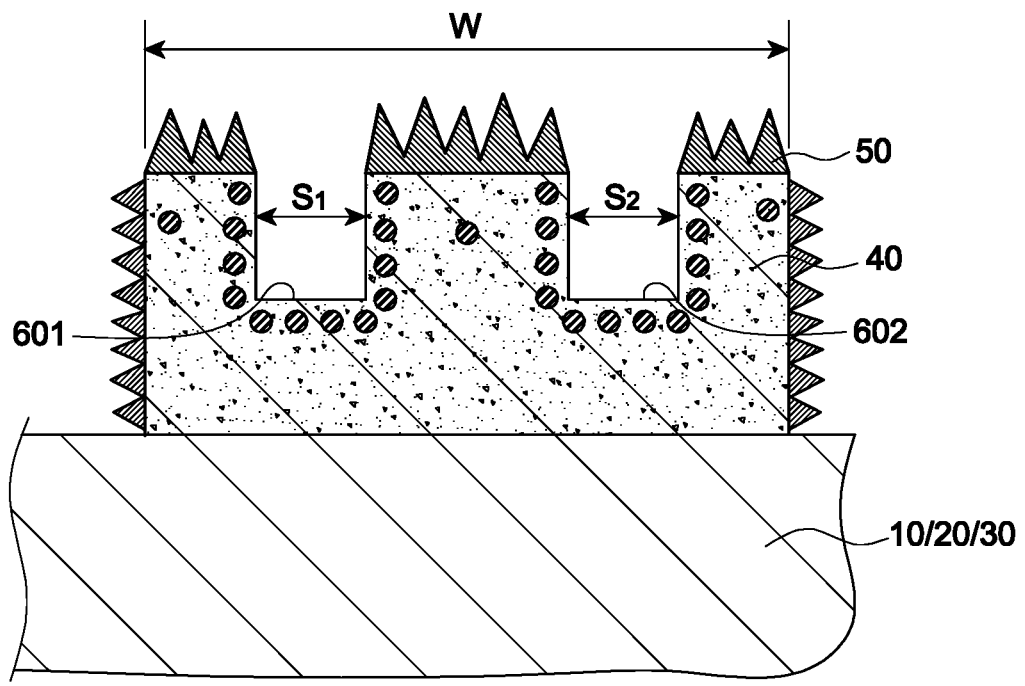
FIG. 9 is a schematic diagram illustrating two rectangular smooth trenches on roughed conductive traces surface formed by the present invention.

From the schematic diagram of FIG. 6B, it can be further understood that the smooth trench 60 is like the aforementioned mountain peaks 501 and valleys 502 being leveled. Since the electron e-flows on the conductor line 40 like walking on a flat road, the resistance is very small. Therefore, the current I passing through the conductor line 40 will increase the flow rate due to the reduced impedance. In the present invention, the cross-sectional shape of the smooth trench 60 includes rectangular grooves or grooves of other geometric shapes, and a number of smooth trenches 60 is even greater. According to the size of the conductor line 40, a plurality of lines can be constructed on the surface. Based on the skin effect that will concentrate the current on the conductor "skin", the plurality of geometric grooves will increase the smooth surface area of the conductor circuit "skin", and therefore can further enhance the flow speed of electrons in the conductor circuit 40, thereby reducing the current, and achieving the effect of reducing conductor signal loss, as shown in FIGS. 8-9. In the present invention, a smooth trench 60 is constructed on the surface of the conductor line 40 to reduce the conductor line impedance and thereby reduce the conductor signal loss, however, the excessively large smooth trench 60 on the roughened surface 50 will also reduce the bonding strength between the conductor circuit 40 and the resin. Therefore, whether a smooth trench 60 is constructed as shown in FIG. 8 or as shown in FIG. 9 construct a first smooth trench 601 and a second smooth trench 602, the smooth trench width S, or the sum of the first channel width S1 and the second channel width S2, if controlled to be not greater than ⅓ of the conductor line width W. There will be the best combination and signal transmission efficiency.

The present invention is based on building one or more smooth trenches 60 formed physically or chemically on the roughened surface of the conductor circuit 40 of the inner and outer circuit boards 10/20. The smooth trenches 60 can includes rectangular grooves or grooves of other geometric shapes. And the smooth trenches 60 can be constructed into a plurality of channels. Based on the principle of skin effect, the current will be concentrated on the characteristics of the conductor "skin", then the grooves of a plurality of geometric shapes, these grooves will increase the smooth surface area of the "skin" of the conductor circuit which can also increase the velocity of electrons flowing in the conductor circuit, thereby reducing the impedance of the conductor circuit, and achieving the effect of reducing conductor insertion loss.

Although particular embodiments of the invention have been described in detail for purposes of illustration, various modifications and enhancements may be made without departing from the spirit and scope of the invention. Accordingly, the invention is not to be limited except as by the appended claims

What is claimed is:

1. A conductor trace structure reducing insertion loss of circuit board, the circuit board laminates at least an outer layer circuit board, at least an inner layer circuit board and a glass fiber resin films which arranged between each board; before laminated process, the conductor traces of the inner layers had formed by etching of imaging transfer process and conductor traces had been roughed process for making the glass fiber resin films having good adhesive performance during laminating; before etching of imaging transfer process that forms the conductor traces of the outer layers or solder resist coat process or coating polymer materials, the conductor traces have been roughed process to make insulating resin layer of the solder resist coat or polymer materials to has better associativity;

Wherein a smooth trench is formed by physical or chemical process constructed on the roughed conductor traces surface to guide electric ions transmitted on these smooth trench surface to enhance electric ions transmission rate, resulting in reducing the impedance so as to achieve reducing insertion loss.

2. A conductor trace structure reducing insertion loss of circuit board as claimed in claim 1, wherein the smooth trench further includes rectangular grooves or grooves of other geometric shapes.

3. A conductor trace structure reducing insertion loss of circuit board as claimed in claim 2, wherein the smooth trench includes a single groove.

4. A conductor trace structure reducing insertion loss of circuit board as claimed in claim 2, wherein the smooth trenches include plurality of grooves.

5. A conductor trace structure reducing insertion loss of circuit board as claimed in claim 1, wherein the smooth trench can be composed of physical method or chemical method or the combination thereof.

6. A conductor trace structure reducing insertion loss of circuit board as claimed in claim 5, wherein the forming method of the smooth trench include laser treatment process, mechanical cutting process, imaging transfer process, plasma etch process and any combination thereof.

* * * * *